US012647116B2

(12) United States Patent
Tsai et al.

(10) Patent No.: US 12,647,116 B2
(45) Date of Patent: Jun. 2, 2026

(54) DECISION FEEDBACK EQUALIZATION IN SEMICONDUCTOR DEVICES

(71) Applicant: Macronix International Co., Ltd., Hsinchu (TW)

(72) Inventors: Chun-Hao Tsai, Taoyuan (TW); Shang-Chi Yang, Changhua County (TW); Shiang-Yuan Li, Tainan (TW); Hsuan-Chieh Lin, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 201 days.

(21) Appl. No.: 18/533,917

(22) Filed: Dec. 8, 2023

(65) Prior Publication Data

US 2025/0141452 A1     May 1, 2025

Related U.S. Application Data

(60) Provisional application No. 63/594,132, filed on Oct. 30, 2023.

(51) Int. Cl.
| | |
|---|---|
| H03K 19/0185 | (2006.01) |
| H03K 19/173 | (2006.01) |
| H03K 19/20 | (2006.01) |

(52) U.S. Cl.
CPC ... H03K 19/01855 (2013.01); H03K 19/1737 (2013.01); H03K 19/20 (2013.01)

(58) Field of Classification Search
CPC ....... H03K 19/0175; H03K 19/017509; H03K 19/01707; H03K 19/01728; H03K 19/0185; H03K 19/018507; H03K 19/01855; H03K 19/173; H03K 19/1737; H03K 19/20; H03K 19/215
See application file for complete search history.

(56) References Cited

U.S. PATENT DOCUMENTS

| | | | |
|---|---|---|---|
| 6,222,403 B1* | 4/2001 | Mitsuda | H03K 19/00361 |
| | | | 327/263 |
| 6,249,150 B1* | 6/2001 | Matsui | G06F 1/04 |
| | | | 327/176 |
| 6,313,681 B1* | 11/2001 | Yoshikawa | H03K 5/133 |
| | | | 327/263 |

(Continued)

FOREIGN PATENT DOCUMENTS

TW            202213949 A      4/2022

*Primary Examiner* — Jason M Crawford
(74) *Attorney, Agent, or Firm* — Fish & Richardson P.C.

(57) ABSTRACT

An electronic circuit includes: a data input port, a timing adjustment circuit configured to receive data from the data input port, first and second logic circuits, a multiplexer, and a data output port. The timing adjustment circuit includes two paths configured to impose first and second delays to generate first and second delayed data. The first and second logic circuits are configured to respectively receive the first and second delayed data and generate first and second logic outputs. The first logic output expands a pulse width corresponding to a first logic value. The second logic output expands a pulse width corresponding to a second logic value. The multiplexer is configured to select, based on an equalization feedback, at least one of the first logic output or the second logic output, to provide the multiplexer output. The data output port is configured to output equalized data based on the multiplexer output.

21 Claims, 10 Drawing Sheets

600

(56)          References Cited

U.S. PATENT DOCUMENTS

| | | | | |
|---|---|---|---|---|
| 6,433,603 | B1 * | 8/2002 | Singh | H03K 3/012 |
| | | | | 327/210 |
| 6,614,371 | B2 | 9/2003 | Zhang | |
| 6,791,995 | B1 | 9/2004 | Azenkot et al. | |
| 8,160,192 | B2 | 4/2012 | Lee et al. | |
| 8,519,763 | B2 | 8/2013 | Ravi et al. | |
| 9,692,417 | B1 * | 6/2017 | Rezayee | H03K 5/1252 |
| 9,917,577 | B1 * | 3/2018 | Rezayee | H03K 17/223 |
| 10,270,217 | B2 * | 4/2019 | Troiani | H04B 10/504 |
| 10,944,385 | B1 * | 3/2021 | Chakkirala | H03K 5/133 |
| 2004/0140832 | A1 * | 7/2004 | Shiah | H03K 5/1534 |
| | | | | 327/170 |
| 2005/0068082 | A1 | 3/2005 | Nguyen et al. | |
| 2011/0175763 | A1 * | 7/2011 | Hsieh | H03M 1/0614 |
| | | | | 341/144 |
| 2018/0062656 | A1 * | 3/2018 | Rezayee | G06Q 20/34 |
| 2022/0084616 | A1 | 3/2022 | Choi | |
| 2025/0141452 | A1 * | 5/2025 | Tsai | H03K 19/1737 |

* cited by examiner

200

400A

400B

1000

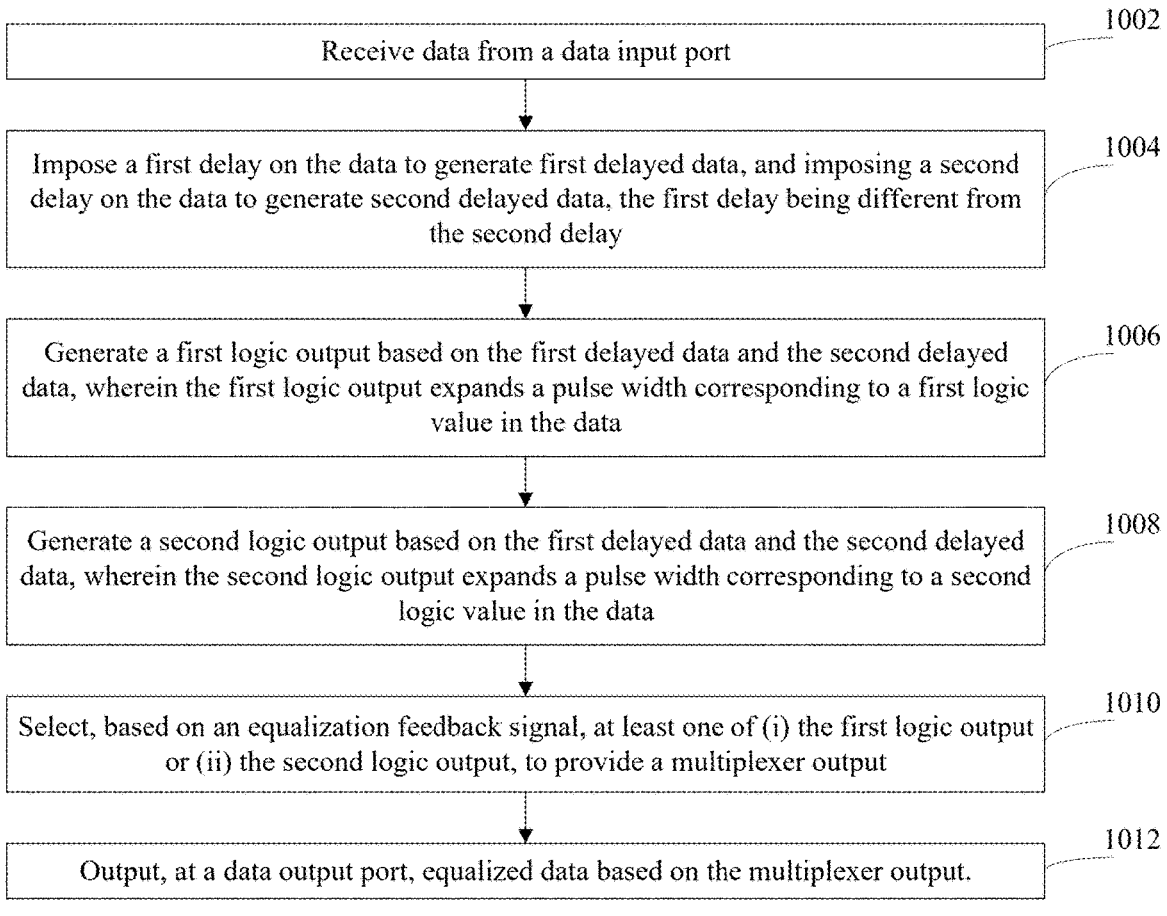

1002

Receive data from a data input port

1004

Impose a first delay on the data to generate first delayed data, and imposing a second delay on the data to generate second delayed data, the first delay being different from the second delay

1006

Generate a first logic output based on the first delayed data and the second delayed data, wherein the first logic output expands a pulse width corresponding to a first logic value in the data

1008

Generate a second logic output based on the first delayed data and the second delayed data, wherein the second logic output expands a pulse width corresponding to a second logic value in the data

1010

Select, based on an equalization feedback signal, at least one of (i) the first logic output or (ii) the second logic output, to provide a multiplexer output

1012

Output, at a data output port, equalized data based on the multiplexer output.

FIG. 10

DECISION FEEDBACK EQUALIZATION IN SEMICONDUCTOR DEVICES

CROSS-REFERENCE TO RELATED APPLICATIONS

This application claims priority to U.S. Provisional Patent Application No. 63/594,132, filed on Oct. 30, 2023, the content of which is incorporated herein by reference.

BACKGROUND

Integrated circuit memory devices are widely used in electronic products to store and transfer data. Recently, there have been increasing demands for memory devices with large storage capacity and high data transfer throughput.

SUMMARY

The present disclosure provides techniques relating to decision feedback equalization (DFE) in semiconductor devices. The disclosed techniques allow performance of pulse width tuning on the complementary metal-oxide-semiconductor (CMOS) level, so that a data valid window can be optimized.

In one aspect, the disclosure describes an electronic circuit. The electronic circuit includes a data input port configured to receive data. The electronic circuit includes a timing adjustment circuit configured to receive the data from the data input port, wherein the timing adjustment circuit includes: a first path configured to impose a first delay on the data to generate first delayed data, and a second path configured to impose a second delay on the data to generate second delayed data, the first delay being different from the second delay. The electronic circuit includes a first logic circuit configured to receive the first delayed data and the second delayed data and generate a first logic output, wherein the first logic output expands a pulse width corresponding to a first logic value in the data. The electronic circuit includes a second logic circuit configured to receive the first delayed data and the second delayed data and generate a second logic output, wherein the second logic output expands a pulse width corresponding to a second logic value in the data. The electronic circuit includes a multiplexer configured to select, based on an equalization feedback signal, at least one of (i) the first logic output or (ii) the second logic output, to provide a multiplexer output. The electronic circuit includes a data output port configured to output equalized data based on the multiplexer output.

In some implementations, the first logic circuit includes an OR gate, and the first logic value includes logic 1. The second logic circuit includes an AND gate, and the second logic value includes logic 0.

In some implementations, the first path includes a first set of one or more inverters, and the second path includes a second set of one or more inverters.

In some implementations, a number of inverters in the first set of one or more inverters is different from a number of inverters in the second set of one or more inverters.

In some implementations, the first path further includes a first set of one or more capacitors. The second path further includes a second set of one or more capacitors. A number of the first set of one or more capacitors is different from a number of the second set of one or more capacitors.

In some implementations, at least one capacitor of the first set of one or more capacitors is tunable, or at least one capacitor of the second set of one or more capacitors is tunable.

In some implementations, at least one first slicer circuit configured to provide the first logic output to a first multiplexer input. At least one second slicer circuit configured to provide the second logic output to a second multiplexer input.

In some implementations, the electronic circuit includes at least one slicer circuit configured to provide the multiplexer output to the data output port.

In some implementations, the timing adjustment circuit further includes a third path configured to impose a third delay on the data to generate third delayed data, the third delay being different from the first delay and the second delay. The electronic circuit further includes: a third logic circuit configured to receive the first delayed data and the third delayed data and generate a third logic output; and a fourth logic circuit configured to receive the first delayed data and the third delayed data and generate a fourth logic output. The multiplexer is configured to select, based on the equalization feedback signal, one of at least (i) the first logic output, (ii) the second logic output, (iii) the third logic output, and (iv) the fourth logic output, to provide the multiplexer output.

In some implementations, the equalization feedback signal includes one or more bits of the equalized data at one or more previous clock cycles.

In some implementations, the multiplexer is a first multiplexer, the equalization feedback signal is a first equalization feedback signal, and the multiplexer output is a first multiplexer output. The electronic circuit further includes a second multiplexer configured to select, based on a second equalization feedback signal, one of at least (i) the first logic output and (ii) the second logic output, to provide a second multiplexer output. The first multiplexer is configured to receive the second multiplexer output as the first equalization feedback signal. The first multiplexer output is synchronized with a first clock and the second multiplexer output is synchronized with a second clock, the first clock and the second clock have a same rate but different phases.

In one aspect, the disclosure describes a memory device including a memory interface circuit, a memory cell array, a data buffer circuit having an input buffer and an equalization circuit, and a control logic circuit coupled to the memory interface circuit, the memory cell array, and the data buffer circuit. The equalization circuit includes a data input port configured to receive data from the input buffer. The equalization circuit includes a timing adjustment circuit configured to receive the data from the data input port. The timing adjustment circuit includes: a first path configured to impose a first delay on the data to generate first delayed data, and a second path configured to impose a second delay on the data to generate second delayed data, the first delay being different from the second delay. The equalization circuit includes a first logic circuit configured to receive the first delayed data and the second delayed data and generate a first logic output. The first logic output expands a pulse width corresponding to a first logic value in the data. The equalization circuit includes a second logic circuit configured to receive the first delayed data and the second delayed data and generate a second logic output. The second logic output expands a pulse width corresponding to a second logic value in the data. The equalization circuit includes a multiplexer configured to select, based on an equalization feedback signal, at least one of (i) the first logic output or (ii) the second logic output, to provide a multiplexer output.

In some implementations, the first logic circuit includes an OR gate, and the first logic value includes logic 1. The second logic circuit includes an AND gate, and the second logic value includes logic 0.

In some implementations, the first path includes a first set of one or more inverters, and the second path includes a second set of one or more inverters.

In some implementations, the first path further includes a first set of one or more capacitors, and the second path further includes a second set of one or more capacitors.

In some implementations, at least one capacitor of the first set of one or more capacitors is tunable, or at least one capacitor of the second set of one or more capacitors is tunable.

In some implementations, the equalization circuit includes at least one first slicer circuit configured to provide the first logic output to a first multiplexer input and at least one second slicer circuit configured to provide the second logic output to a second multiplexer input.

In some implementations, the equalization circuit includes at least one slicer circuit configured to provide the multiplexer output to the data output port.

In some implementations, the timing adjustment circuit further includes a third path configured to impose a third delay on the data to generate third delayed data, the third delay being different from the first delay and the second delay. The equalization circuit further includes: a third logic circuit configured to receive the first delayed data and the third delayed data and generate a third logic output; and a fourth logic circuit configured to receive the first delayed data and the third delayed data and generate a fourth logic output. The multiplexer is configured to select, based on the equalization feedback signal, one of at least (i) the first logic output, (ii) the second logic output, (iii) the third logic output, and (iv) the fourth logic output, to provide the multiplexer output.

In some implementations, the equalization feedback signal includes one or more bits of the equalized data at one or more previous clock cycles.

In some implementations, the multiplexer is a first multiplexer, the equalization feedback signal is a first equalization feedback signal, and the multiplexer output is a first multiplexer output. The equalization circuit further includes a second multiplexer configured to select, based on a second equalization feedback signal, one of at least (i) the first logic output and (ii) the second logic output, to provide a second multiplexer output. The first multiplexer is configured to receive the second multiplexer output as the first equalization feedback signal. The first multiplexer output is synchronized with a first clock and the second multiplexer output is synchronized with a second clock, the first clock and the second clock have a same rate but different phases.

In one aspect, the disclosure describes a method for compensating for data distortion from channel loss. The method includes receiving data from a data input port. The method includes imposing a first delay on the data to generate first delayed data, and imposing a second delay on the data to generate second delayed data, the first delay being different from the second delay. The method includes generating a first logic output based on the first delayed data and the second delayed data, wherein the first logic output expands a pulse width corresponding to a first logic value in the data. The method includes generating a second logic output based on the first delayed data and the second delayed data, wherein the second logic output expands a pulse width corresponding to a second logic value in the data. The method includes selecting, based on an equalization feedback signal, at least one of (i) the first logic output or (ii) the second logic output, to provide a multiplexer output. The method includes outputting, at a data output port, equalized data based on the multiplexer output.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 10 illustrates a flowchart of an example method for decision feedback equalization in memory devices, according to some implementations.

Figures are not drawn to scale. Like reference numbers refer to like components.

DETAILED DESCRIPTION

Figure 1:
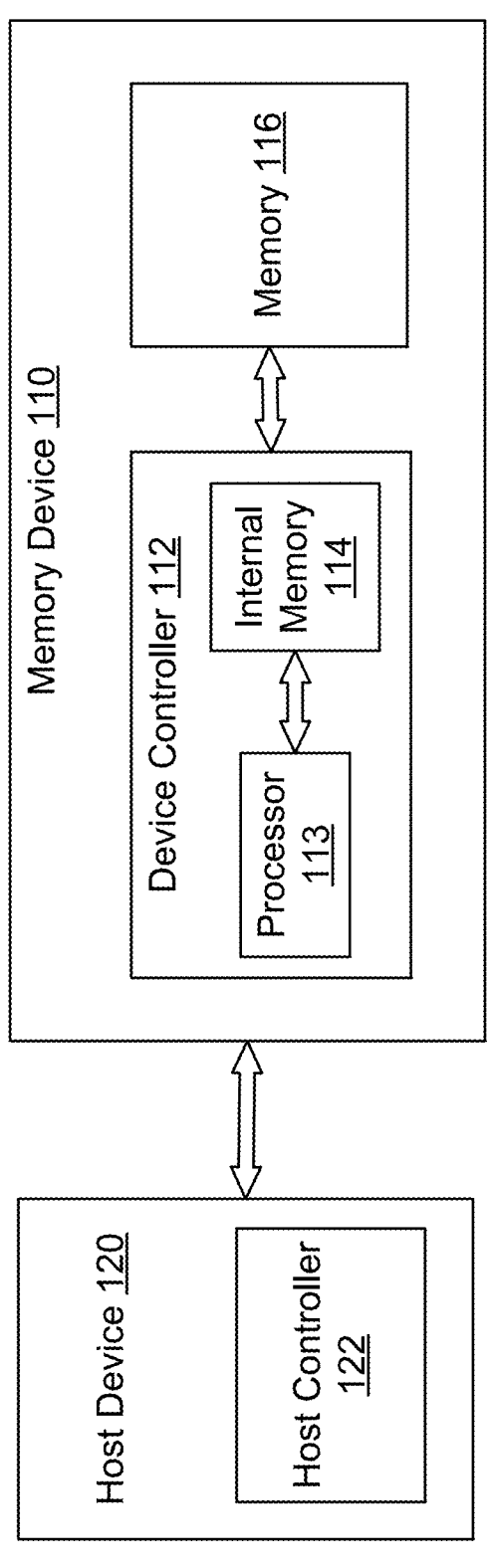
FIG. 1 illustrates a block diagram of an example system including a memory device, according to one or more implementations.

A semiconductor device (e.g., a memory device) can receive input data from a host device, such as a personal computer, via a data transmission channel. The data transmission is often prone to noise and interference that cause distortion of the data waveform sampled by the semiconductor device. One type of interference is inter-symbol interference (ISI). With ISI, a first data symbol (e.g., a bit) having a voltage level (e.g., logic 0) sampled at an earlier clock cycle can cause a second data symbol having a different voltage level (e.g., logic 1) sampled at a later clock cycle to have a reduced pulse width. The reduction in pulse width of the second data symbol can increase the probability of data error rate.

To mitigate the effect of ISI, some semiconductor devices implement an equalization circuit, such as a DFE circuit, that can adjust the waveform of the received input data based on one or more previous symbols of the DFE output. As such, the later symbol of the output signal can take into account the earlier symbols and compensate for the reduction of pulse width. Because the level of ISI often varies for different data transmission channels and different data transmission speeds, the amount of pulse width compensation ("compensation space") may need to be adjusted for different data transmission scenarios. Accordingly, it is desirable for a DFE to have the flexibility to tune up the pulse width compensation. In addition, given the growing demand for high data storage density and small size of memory devices, it is desirable for a DFE to have a simple structure.

Implementations of the present disclosure provide techniques for addressing the above challenges. In some implementations, a DFE has a timing adjustment circuit, such as a delay line, that provides the input data on different timing paths with different delays, where the amount of delay on each path can be adjustable. The DFE also has logic circuitry that can adjust the pulse width of the input data according to basic logic operations. With one or more features described below, implementations of this disclosure provide a DFE architecture with high flexibility and low complexity.

The techniques can be applied to any suitable circuits or devices such as semiconductor devices. For illustration purposes, a memory device is described herein as an example of a semiconductor device. For example, the techniques can be applied to various types of non-volatile memory devices such as NOR flash memory devices, NAND flash memory devices, erasable programmable read-only memory (EPROM), Static Random Access Memory (SRAM), Resistive random-access memory (RRAM), Ferroelectric Random Access Memory (FeRAM), Magnetoresistive random-access memory (MRAM), among others. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), solid-state drives (SSDs), embedded systems, or computing network devices, among others.

FIG. 1 illustrates an example system 100 including a memory device, according to one or more implementations. The system 100 includes a memory device 110 and a host device 120. The memory device 110 includes a device controller 112 and a memory 116. The device controller 112 includes a processor 113 and an internal memory 114. In some implementations, the memory device 110 includes a plurality of memories 116 that are coupled to the device controller 112.

In some implementations, the memory device 110 is a storage device. For example, the memory device 110 can be an embedded multimedia card (eMMC), a secure digital (SD) card, a solid-state drive (SSD), or some other suitable storage. In some implementations, the memory device 110 is a smart watch, a digital camera or a media player. In some implementations, the memory device 110 is a client device that is coupled to a host device 120. For example, the memory device 110 is an SD card in a digital camera or a media player that is the host device 120.

The device controller 112 is a general-purpose microprocessor, or an application-specific microcontroller. In some implementations, the device controller 112 is a memory controller for the memory device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the memory device 110 is an eMMC, an SD card or a smart watch, the internal memory 114 is an SRAM. In some implementations, when the memory device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the memory device 110 is a flash memory device, e.g., a flash memory card, and the device controller 112 is a NAND flash controller. For example, in some implementations, when the memory device 110 is an eMMC or an SD card, the memory 116 is a NAND flash; in some implementations, when the memory device 110 is a digital camera, the memory 116 is an SD card; and in some implementations, when the memory device 110 is a media player, the memory 116 is a hard disk.

The memory 116 includes a plurality of blocks. The memory 116 can be a two-dimensional (2D) memory including 2D memory blocks. The memory 116 can also be a three-dimensional (3D) memory including 3D memory blocks.

Figure 2:
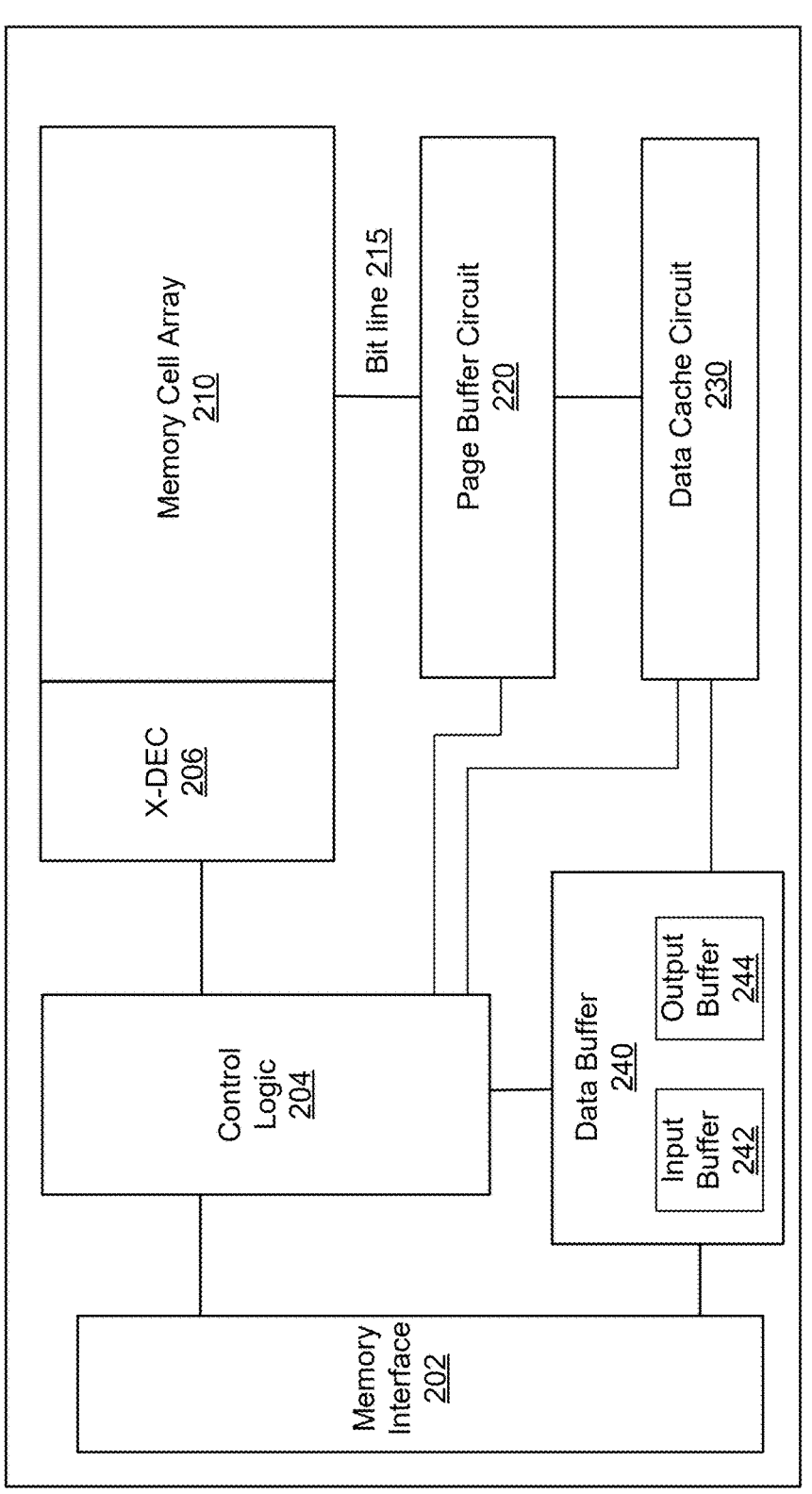
FIG. 2 illustrates a block diagram of an example memory device, according to some implementations.

FIG. 2 illustrates an example memory device 200, according to one or more implementations. The memory device 200 can be implemented as the memory 116 of FIG. 1. The memory device 200 includes a memory cell array 210. The memory cell array 210 can include a number of memory cells coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory metal-oxide-semiconductor (MOS) device that can store charges.

The memory device 200 includes a memory interface 202 having multiple input/output (I/O) ports for receiving data, e.g., from a controller such as the device controller 112 of FIG. 1 or the host controller 122 of FIG. 1, or outputting data from the memory cell array 210. The memory device 200 includes a data buffer 240 configured to buffer data through the memory interface 202. The data buffer 240 can include a data input buffer 242 configured to buffer/transmit data from a controller (e.g., the device controller 112 of FIG. 1 or the host controller 122 of FIG. 1) through the memory interface 202 to the memory cell array 210. The data buffer 240 can also include a data output buffer 244 configured to buffer/transmit out data from the memory cell array 210 through the memory interface 202, e.g., to a host device such as the host device 120 of FIG. 1.

In some implementations, the memory device 200 further includes an X-decoder (or row decoder) 206 and an optional Y-decoder (not shown). Each memory cell is coupled to the X-decoder 206 via a respective word line and coupled to the Y-decoder via a respective bit line 215. Accordingly, each memory cell can be selected by the X-decoder 206 and the Y-decoder for read or write operations through the respective word line and the respective bit line 215.

The memory device 200 includes a page buffer circuit 220 that includes a number of page buffers. Each page buffer is connected to the memory cell array 210 through a respective bit line 215. In some implementations, a page buffer is connected to the Y-decoder through a data line associated with a corresponding bit line 215 that connects a corresponding line of memory cells in the memory cell array 210. A page buffer is configured to control a voltage on a corresponding bit line to perform an operation, e.g., read, program, or erase, on a memory cell coupled to the corresponding bit line. A page buffer can include at least one latch circuit.

In some implementations, the memory device 200 further includes a data cache circuit 230 coupled between the page buffer circuit 220 and the data buffer 240. During a program or erase operation, the data cache circuit 230 is configured to store data from the data buffer 240 (e.g., from the data input buffer 242) and/or output through the page buffer circuit 220 to the memory cell array 210. During a read operation, the data cache circuit 230 is configured to store data from the memory cell array through the page buffer circuit 220 and/or output data to the data buffer 240 (e.g., to the data output buffer 244).

In some implementations, the memory device 200 further includes a control logic 204 coupled to components in the memory device 200 including the X-decoder 206 and the Y-decoder, the data buffer 240, the page buffer circuit 220, and the data cache circuit 230. The control logic 204 is configured to receive a command, address information, and/or data, e.g., from a memory controller such as the device controller 112 or the host controller 122 of FIG. 1, via the memory interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components.

In some implementations, the control logic 204 includes a data register, an SRAM buffer, an address generator, a mode logic, and a state machine. The mode logic can be configured to determine whether there is a read or write operation and provide a result of the determination to the state machine.

During a write operation, the data register in the control logic 204 can register input data from the memory interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer can sense a small power signal (e.g., a current signal) that represents a data bit ("1" or "0") stored in the selected memory cell through a bit line 215 coupled to the page buffer and the selected memory cell. A sense amplifier can amplify the small power signal swing to recognizable logic levels so the data bit can be interpreted properly by logic inside or outside the memory device 200. In some implementations, the page buffer circuit 220 and/or the data cache circuit 230 are included in the sense amplifier. The data buffer 240 (e.g., the data output buffer 244) can receive the amplified voltage from the sensor amplifier and output the amplified power signal to the logic outside the memory device 200 through the memory interface 202.

Figure 3A:
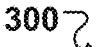
FIG. 3A illustrates a waveform distorted by channel ISI and a waveform compensated by DFE, according to some implementations.
Figure 3A:
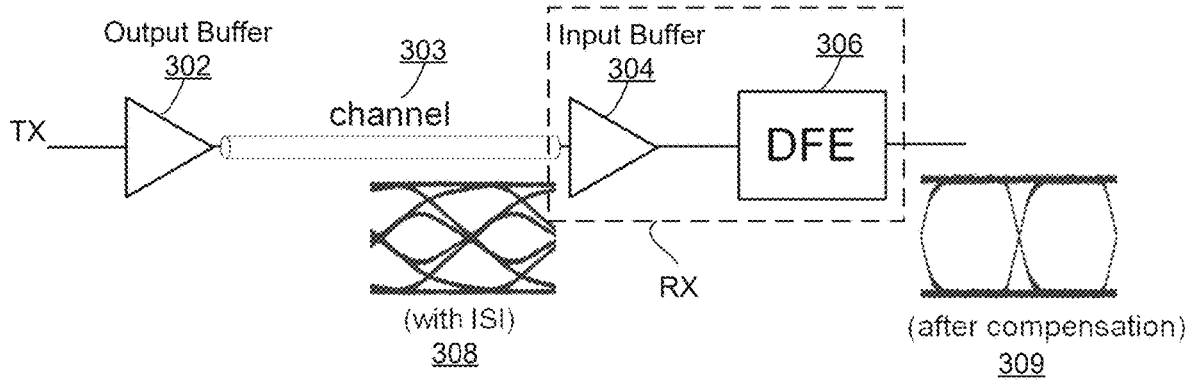

FIG. 3A illustrates a waveform 308 distorted by channel ISI and a waveform 309 compensated by DFE, according to some implementations. The distortion and the compensation are shown to happen in a system 300, which can be the same as the system 100 of FIG. 1.

As illustrated, on the transmission (TX) side, the system 100 includes an output buffer 302 that outputs data on the channel 303. On the receiving (RX) side, the system 100 includes an input buffer 304 that receives the data from the channel 303 and a DFE 306 that compensates for the waveform distortion. From the eye diagram of the waveform 308, it can be seen that the channel 303 causes ISI on nearby symbols such that the symbol pulses have relatively long tails and less steep rising and falling edges, as opposed to desired pulse shapes with nearly vertical rising and falling edges. On the other hand, after waveform compensation by the DFE 306, the waveform 309 can be seen to have sharper edges.

Figure 3B:
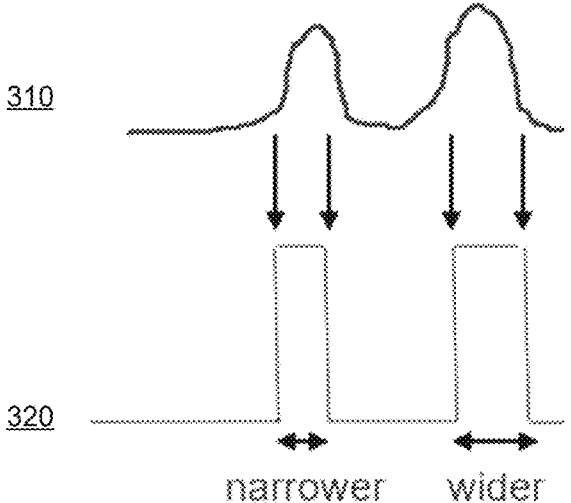
FIG. 3B illustrates the impact of ISI on symbol pulse width if not compensated by DFE.

FIG. 3B illustrates the impact of ISI on symbol pulse width if not compensated by DFE. Typically, in systems such as the system 300, symbols obtained by an input buffer undergo analog-to-digital conversion to be processed and stored. Because of the ISI's impact on the symbol waveforms, some symbols are converted to have reduced pulse width in the digital domain. For example, the waveform 310 is shown to be affected by distortion caused by ISI. After analog-to-digital conversion, the waveform 320 has a narrower pulse due to stronger impact of ISI and a wider pulse due to less impact of ISI, even though in ISI-free scenarios the two pulses should have the same width or similar widths.

A DFE according to some implementations can mitigate the above-described waveform distortion. As described below, the DFE utilizes a timing adjustment circuit and logic circuitry to respectively expand the pulse width of a logic '0' preceded by a logic '1' and the pulse width of a logic '1' preceded by a logic '0.' The DFE then utilizes one or more multiplexers (MUXs) to selectively output the symbol with expanded pulse width.

Figure 4A:
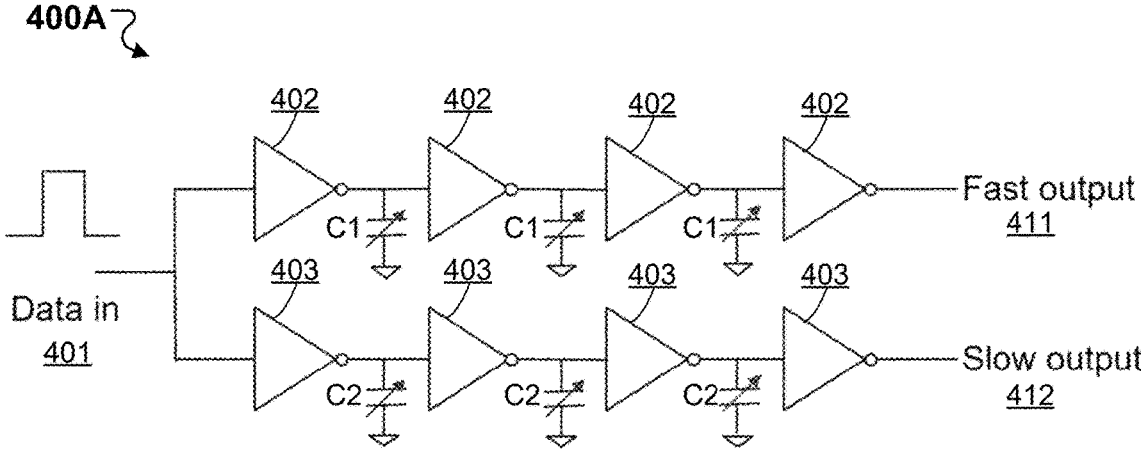
FIGS. 4A and 4B each illustrate an example of a timing adjustment circuit, according to some implementations.
Figure 4B:
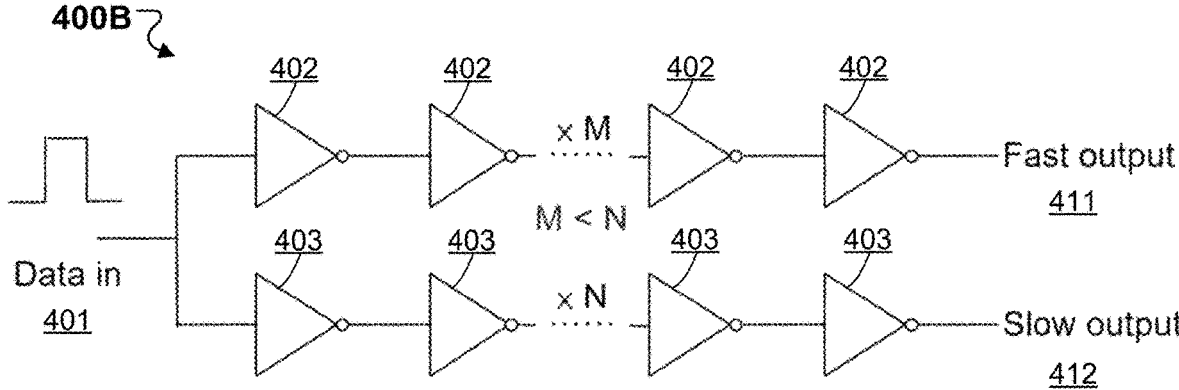

FIGS. 4A and 4B each illustrate an example of a timing adjustment circuit, 400A and 400B, respectively, according to some implementations. Each of the timing adjustment circuits 400A and 400B receives input data ("data in" or "data input") 401 and provides a fast output ("fast out") 411 and a slow output ("slow out") 412, respectively, from two paths. Each path has a plurality of inverters (or buffers), 402 and 403, respectively.

Starting with FIG. 4A, on the path from the data in 401 to the fast output 411 ("fast path"), the timing adjustment circuit 400A has one or more capacitors C1 connected at the output of some or all inverters 402. Similarly, on the path from the data in 401 to the slow output 412 ("slow path"), the timing adjustment circuit 400A has one or more capacitors C2 connected at the output of some or all inverters 403. Capacitors C1 and C2 can include, e.g., one or more MOS capacitors, one or more metal-insulator-metal (MIM) capacitors, one or more metal-oxide-semiconductor capacitors (MOSCAPs), or one or more multilayer ceramic capacitors (MLCCs). The inverters/buffers 402 and 403 can have the same structure and can each impose the same amount of delay on signals passing on the corresponding path. Additionally, each of the capacitors C1 and C2 can impose delay on signals passing on the corresponding path. Accordingly, when the number of the inverters/buffers 402 equals the number of the inverters/buffers 403, different capacitance values of C1 and C2 can cause the delays on the two paths to be different. For example, in a scenario where each path has four identical inverters/buffers 402 and 403, making the capacitance value of C1 less than the capacitance value of C2 can cause the delay on the fast path to be smaller than the delay on the slow path. Accordingly, the data in 401 traveling on the fast path arrives at the fast output 411 earlier than traveling on the slow path at the slow output 412.

Moving to FIG. 4B, the timing adjustment circuit 400B is shown to have M inverters/buffers 402 on the fast path and N inverters/buffers 403 on the slow path, where M and N are different integers and M<N. Accordingly, when each of the inverters/buffers 402 and 403 imposes the same amount of delay on signals passing on the corresponding path, the data in 401 traveling on the fast path experiences less delay than traveling on the slow path. In other words, the data in 401 traveling on the fast path arrives at the fast output 411 earlier than traveling on the slow path at the slow output 412.

Figure 4C:
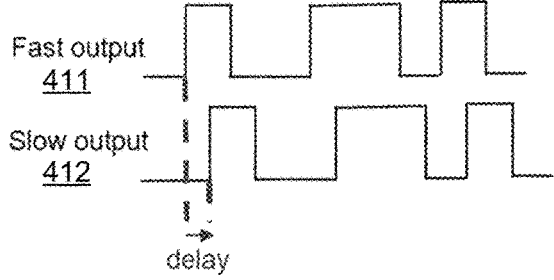
FIG. 4C illustrates a difference of delay between two paths imposed by a timing adjustment circuit, according to some implementations.

FIG. 4C illustrates a difference of delay between two paths imposed by a timing adjustment circuit, such as the timing adjustment circuit 400A or 400B, according to some implementations. As shown in FIG. 4C, data arrives at the fast output 411 earlier than at the slow output 412 by an amount of relative delay. The relative delay can be attributed to different capacitance values on the two paths, as in the timing adjustment circuit 400A, or different numbers of inverters on each path, as in the timing adjustment circuit 400B. In addition to the timing adjustment circuits 400A and 400B, other timing adjustment circuits can have the same or similar effect of relative delay. For example, some timing adjustment circuits can provide the relative delay between two paths by using different numbers of inverters/buffers combined with different capacitance values on the two paths. Some timing adjustment circuits can provide the relative delay by using the same numbers of inverters/buffers combined with different numbers of capacitors on the two paths. Some timing adjustment circuits can provide the relative delay by using the same number of inverters/buffers with different structures, sizes, or MOS field-effect transistor (MOSFET) driving strengths. Many other implementations of the timing adjustment circuit, such as combinations of the above-described examples, are possible. For the sake of brevity, they are omitted from the description.

In some implementations, the relative delay between the fast path and the slow path is tunable. For example, in the timing adjustment circuit 400A, some or all of the capacitors C1 and C2 can be tunable MOS capacitors whose capacitance values can be controlled by a switch. One can accordingly adjust the relative delay by adjusting the capacitance values of some or all of these capacitors. As another example, in the timing adjustment circuits 400A and 400B, the driving strength (e.g., a driving voltage level) of some or all of the inverters/buffers 402 and 403 can be adjusted by an adjustable driver such that the delays caused by those inverters/buffers are changed.

While the timing adjustment circuits described with reference to FIGS. 4A-4C only have two paths, it is possible for a timing adjustment circuit to have more paths, with each path imposing a different delay between the input of data and the output of data. For example, in some implementations, a timing adjustment circuit has three paths each imposing a different delay. The path with the smallest delay can be referred to as a fast path and the corresponding output can be referred to as the fast output or the fast out. The path with the intermediate delay can be referred to as a medium path and the corresponding output can be referred to as a medium output or a medium out. The path with the largest delay can be referred to as a slow path and the corresponding output can be referred to as the slow output or the slow out. The structure and the operations of timing adjustment circuits with more than two paths would have been readily understood by one of ordinary skill in the art upon reading the above description of two-path timing adjustment circuits.

Figure 5:
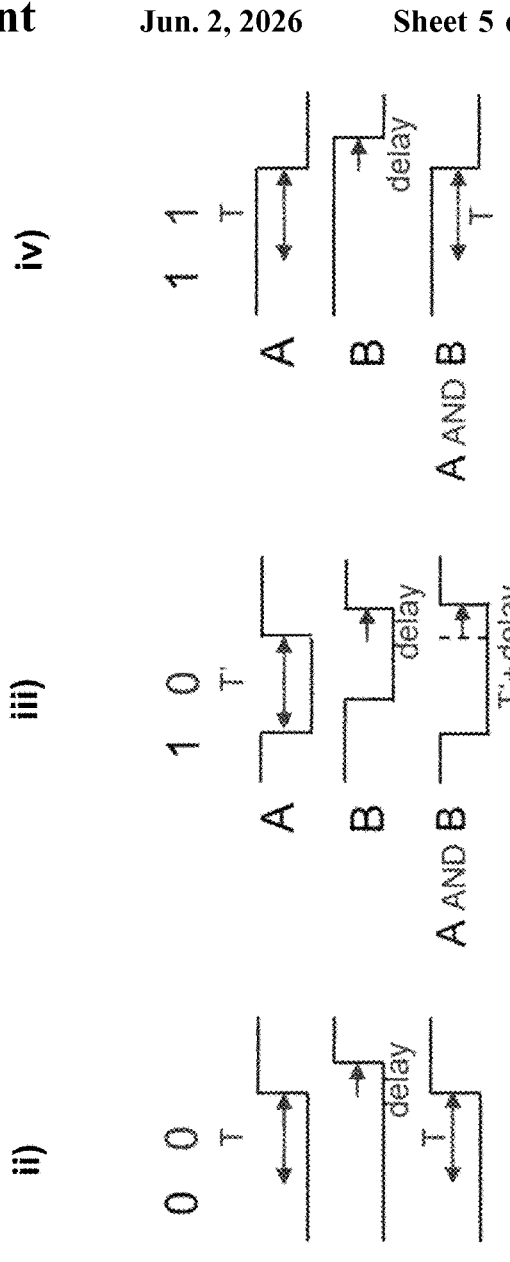
FIG. 5 illustrates compensation of pulse widths after logic operations, according to some implementations.

FIG. 5 illustrates compensation of pulse widths after logic operations, according to some implementations. FIG. 5 illustrates four different scenarios: i) logic '1' with a preceding logic '0'; ii) logic '0' with a preceding logic '0'; iii) logic '0' with a preceding logic '1'; and iv) logic '1' with a preceding logic '1'. Each scenario involves a signal A and a signal B that have the same symbol values, with the signal B being behind the signal A by a delay. Accordingly, the signal A in these scenarios can be provided by a timing adjustment circuit as a fast output while the signal B in these scenarios can be provided by the timing adjustment circuit as a slow output. In scenarios i) and ii), an OR operation is performed on signals A and B. In scenarios iii) and iv), an AND operation is performed on signals A and B.

In scenario i), the change from logic '0' to logic '1' makes the signals A and B prone to ISI. Because of ISI, the symbol for logic '1' in each signal has a reduced pulse width T', as opposed to a non-reduced pulse width T when there is no distortion caused by ISI. After an OR operation, the output signal (A OR B) has a pulse width of T'+delay. As such, the OR operation effectively expands the logic '1' pulse width of the fast output (signal A) by an amount equaling the delay.

In scenario ii), because the signals A and B remain at logic '0,' ISI does not have any reduction on the pulse width of the second symbol, so the second symbol of logic '0' has non-reduced pulse width T in both signals A and B. After an OR operation, the logic '0' pulse width of the fast output (signal A) remains T unchanged.

In scenario iii), the change from logic '1' to logic '0' makes the signals A and B prone to ISI. Because of ISI, the symbol for logic '0' in each signal has a reduced pulse width T', as opposed to a non-reduced pulse width T when there is no distortion caused by ISI. After an AND operation, the output signal (A AND B) has a pulse width of T'+delay. As such, the AND operation effectively expands the logic '0' pulse width of the fast output (signal A) by an amount equaling the delay.

In scenario iv), because the signals A and B remain at logic '1,' ISI does not have any reduction on the pulse width of the second symbol, so the second symbol of logic '1' has non-reduced pulse width T in both signals A and B. After an AND operation, the logic '1' pulse width of the fast output (signal A) remains T unchanged.

According to the discussion with reference to scenarios i)-iv), when a signal has a symbol preceded by a bit of logic '0,' an OR operation can be performed on the signal (e.g., the signal A in FIG. 5) and a delayed version of the signal (e.g., the signal B in FIG. 5) to mitigate pulse width reduction due to ISI. Likewise, when a signal has a symbol preceded by a bit of logic '1,' an AND operation can be performed on the signal (e.g., the signal A in FIG. 5) and a delayed version of the signal (e.g., the signal B in FIG. 5) to mitigate pulse width reduction due to ISI. As described below with reference to FIGS. 6-9, implementations of this disclosure provide DFE circuits, 600-900, respectively, that are consistent with these mechanisms. Each of the DFE circuits 600-900 can be implemented in the memory device 200 of FIG. 2, e.g., as part of the data buffer 240.

It is noted that the delay between the two paths can be configured to meet certain constraints. For example, the delay can be configured to be large enough to sufficiently compensate for the pulse width reduction. On the other hand, the delay should generally be configured not to exceed one UI (where UI represents a period of each bit of the input data), because otherwise the pulse of the slow output (e.g., signal B in FIG. 5) may come too late to take part in the logic operation with the pulse of the fast output (e.g., signal A in FIG. 5). In some implementations, for a data rate of 4 gigabit per second (Gb/s) (1 UI=250 picosecond [ps]), the delay is configured to be about 125 ps so the pulse of the slow output can overlap the pulse of the fast output.

Figure 6:
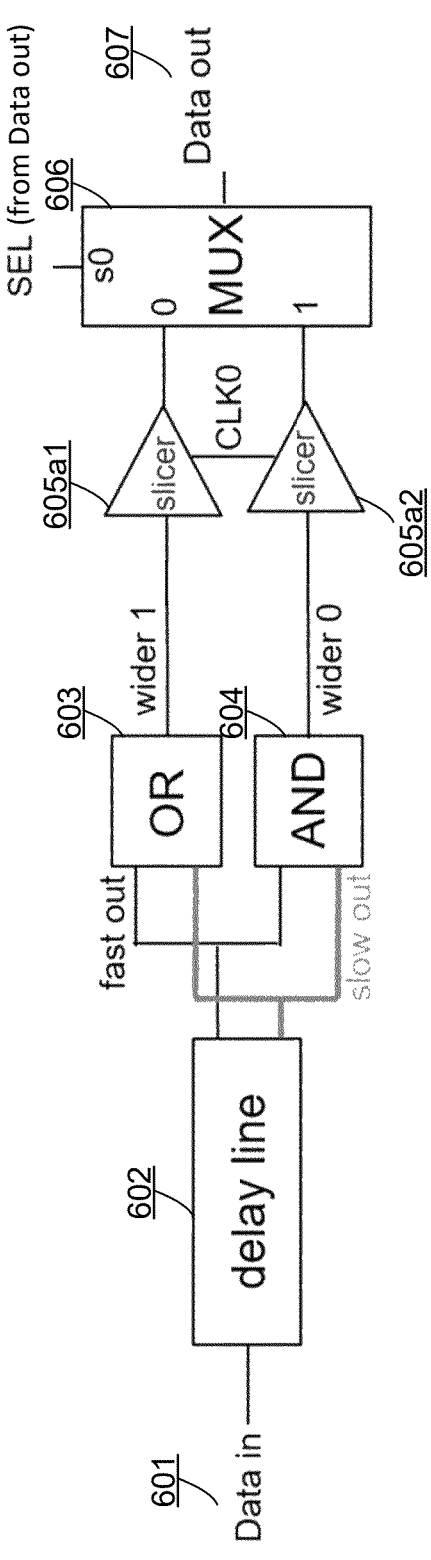
FIGS. 6-9 each illustrate an example DFE circuit, according to some implementations.

FIG. 6 illustrates an example DFE circuit 600, according to some implementations. The DFE circuit 600 receives input data from an input port 601 and, after compensation, outputs equalized data at an output port 607.

The DFE circuit 600 has a delay line 602, which can be similar to timing adjustment circuits 400A or 400B, that generates a fast out and a slow out. Each of the fast out and the slow out is input to an OR gate 603 (or an equivalent logic circuit) and to an AND gate 604 (or an equivalent logic circuit). The OR gate 603 can expand the ISI-distorted pulse width of logic '1's, while the AND gate 604 can expand the ISI-distorted pulse width of logic '0's.

The logic operation outputs of the OR gate 603 and the AND gate 604 are each input to a slicer, 605a1 and 605a2, respectively. The slicers 605a1 and 605a2 can be, e.g., Strong Arm latch circuits and can each include a flip-flop circuit to synchronize the outputs of the OR gate 603 and the AND gate 604 with a clock signal CLK0.

The outputs of the slicers 605a1 and 605a2 are provided as inputs to a one-bit MUX 606, whose output is provided on the output port 607 and is selected by a one-bit selection signal SEL. For example, when SEL has a value of logic '0,' the signal at the "0" input pin of the MUX 606, which corresponds to the output of the OR gate 603, is passed to the output port 607. Conversely, when SEL has a value of logic '1,' the signal at the "1" input pin of the MUX 606, which corresponds to the output of the AND gate 604, is passed to the output port 607.

The output signal at the output port 607 is fed back to the MUX 606 as the selection signal SEL provided to a selection pin s0. That is, the MUX 606 selects whether to output the signal at the "0" input pin or the signal at the "1" input pin based on the value of a previous bit of the data out 607. With this configuration, when the previous bit at the output port 607 is logic '0,' the MUX 606 selects the signal at the "0" input pin, which corresponds to the output of the OR gate 603. As respectively described in scenarios i) and ii) with reference to FIG. 5, the output of the OR gate 603 can expand the pulse width of a current bit of logic '1' (which is prone to ISI distortion due to the 0-to-1 transition) while keeping the pulse width of a current bit of logic '0' (which is not affected by ISI distortion because the logic value does not change) unchanged. Likewise, when the previous bit at the output port 607 is logic '1,' the MUX 606 selects the signal at the "1" input pin, which corresponds to the output of the AND gate 604. As respectively described in scenarios iii) and iv) with reference to FIG. 5, the output of the AND gate 604 can expand the pulse width of a current bit of logic '0' (which is prone to ISI distortion due to the 1-to-0 transition) while keeping the pulse width of a current bit of logic '1' (which is not affected by ISI distortion because the logic value does not change) unchanged. Accordingly, by outputting the data out 607 as equalization output, the DFE circuit 600 can compensate for ISI-caused waveform distortion.

As discussed above, the selection signal SEL is fed back from the output port 607 as the previous bit of the output signal. In order for the MUX 606 to timely make a selection, the delay from the arrival of the feedback signal at the selection pin s0 to a time when the MUX 606 makes the selection, known as the MUX delay of the MUX 606, is configured to be less than 1 UI.

Figure 7:
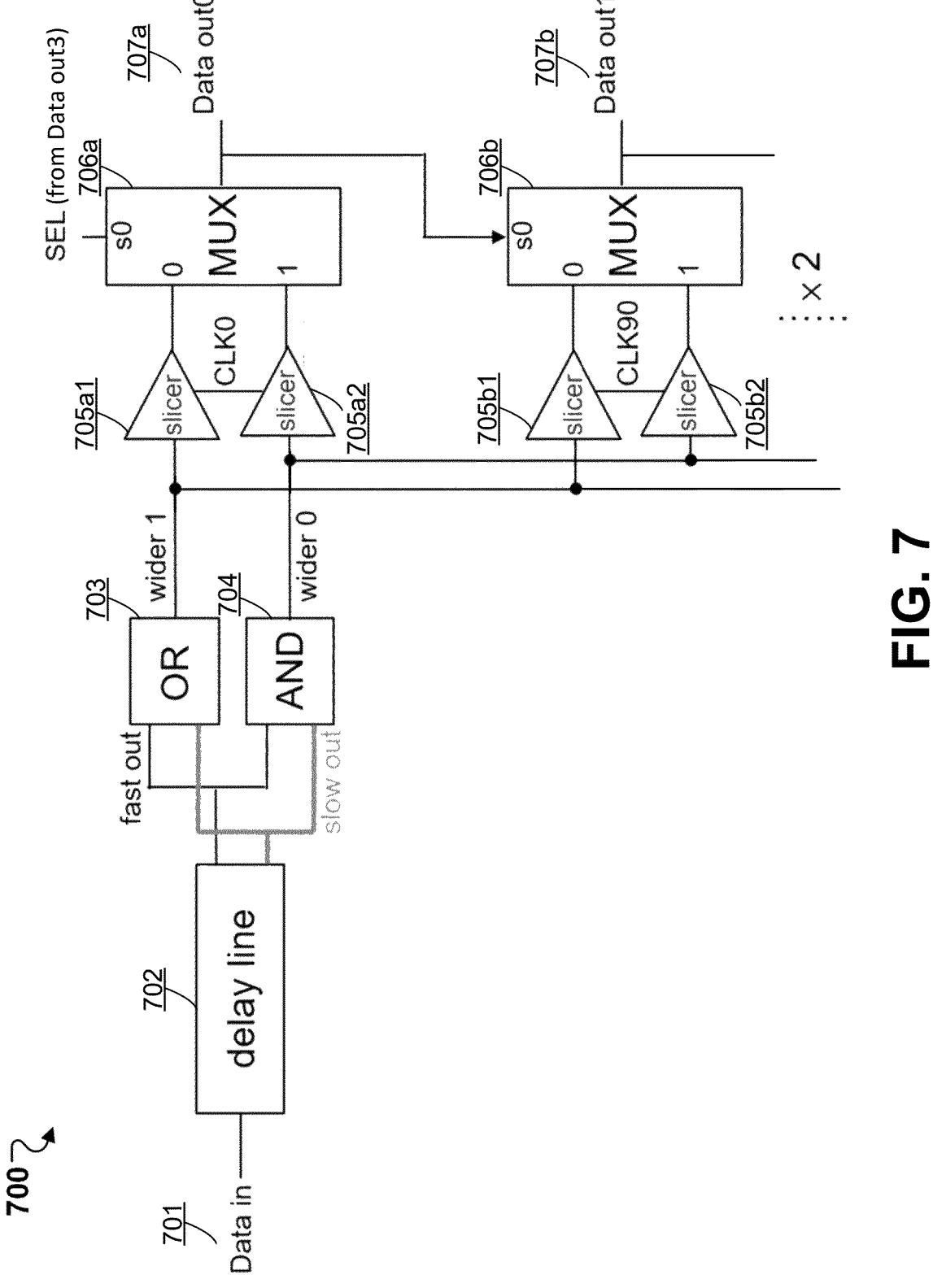

FIG. 7 illustrates an example DFE circuit 700, according to some implementations. The DFE circuit 700 receives input data from an input port 701 and, after compensation, outputs equalized data at output ports 707a, 707b, 707c, and 707d, which are collectively referred to as output ports 707. As described below, the circuits for outputting equalized data at output ports 707c and 707d are substantially the same as those for outputting equalized data at output ports 707a and 707b. Accordingly, illustrations of the output ports 707c and 707d are omitted from FIG. 7.

Similar to the operations of the DFE circuit 600, the delay line 702, the OR gate 703, and the AND gate 704 of the DFE circuit 700 provide two logic operation outputs that respectively expand ISI-distorted pulse widths of logic '1's and logic '0's. Also similar to the operations of the DFE circuit 600, the two logic operation outputs from the OR gate 703 and the AND gate 704 are respectively provided to the slicers 705a1 and 705a2 to be synchronized with the clock signal CLK0 and then respectively input to the MUX 706a as the "0" input and the "1" input. The MUX 706a then selectively outputs the data out 707 as the signal at either of its "0" input or "1" input.

Different from the DFE circuit 600, the DFE circuit 700 has three additional copies of the slicer-MUX combination circuit. For example, the two logic operation outputs from the OR gate 703 and the AND gate 704 are respectively provided to the slicers 705b1 and 705b2 to be synchronized with the clock signal CLK90 and then respectively input to the MUX 706b as the "0" input and the "1" input. The MUX 706b then selectively outputs the data out 707b as the signal at either of its "0" input or "1" input.

Likewise, the DFE circuit 700 has slicers 705c1 and 705c2 to be synchronized with a clock signal CLK180 and then respectively input to a MUX 706c, which selectively outputs a data out 707c as the signal at either of its "0" input or "1" input. The DFE circuit 700 also has slicers 705d1 and 705d2 to be synchronized with a clock signal CLK270 and then respectively input to a MUX 706d, which selectively outputs a data out 707d as the signal at either of its "0" input or "1" input. For the sake of simplification, these components and connection thereof are represented by the "x2" symbol and not illustrated in detail in FIG. 7.

For the MUXes 706a-706d to make selections, the output data at the output port 707a is fed back to the selection pin s0 of the MUX 706b. This way, the selection by the MUX 706b is based on a previous bit of the output data at the output port 707a. Likewise, the output data at the output ports 707b, 707c, and 707d are respectively fed back to the selection pin s0 of the MUXes 706c, 706d, and 706a.

The clock signals CLK0, CLK90, CLK180, and CLK270 together constitute four-phase clocking. The clock signals CLK0, CLK90, CLK180, and CLK270 have the same frequency while each phase having a difference of 90 degrees. For example, within a clock cycle, the clock signal CLK0 asserts at a beginning of the clock cycle and lasts a quarter of the clock cycle, the clock signals CLK90, CLK180, and CLK270 then successively assert and each last another quarter of the clock cycle. By making the frequency of the clock signals CLK0, CLK90, CLK180, and CLK270 a quarter of the data rate of the input data at the input port 701, the DFE circuit 700 is configured with a quarter-rate equalization output (as opposed to a full-rate equalization output in the DFE circuit 600), in which equalized data can be successively provided at the four output ports 707a-707d. The output data rate at each of the output ports 707a-707d is a quarter of the input data rate at the input port 701.

As discussed above, in the DFE circuit 700, the selection signal SEL of each MUX is fed back from an output of a neighboring MUX. In order for each MUX to timely make a selection, the delay from the arrival of the feedback signal at the selection pin s0 to a time when that MUX makes the selection is configured to be less than 1 UI. For example, the MUX delay of the MUX 706a is less than 1 UI (which equals the duration from a rising edge of CLK0 to the following rising edge of CLK90). Likewise, the MUX delays of the MUXes 706b-706d are less than 1 UI.

Besides the full rate and the quarter-rate configurations, other implementations can have output data synchronized at different clock rates. For example, in some implementations, a DFE circuit has eight copies of the slicer-MUX combination circuits, with the slicers driven by eight-phase clocking. In implementations with multi-rate configurations, output data has lower frequency at each of the output ports than with full-rate configurations. This can make further data processing (e.g., analog-to-digital conversion) less time-constrained.

Figure 8:
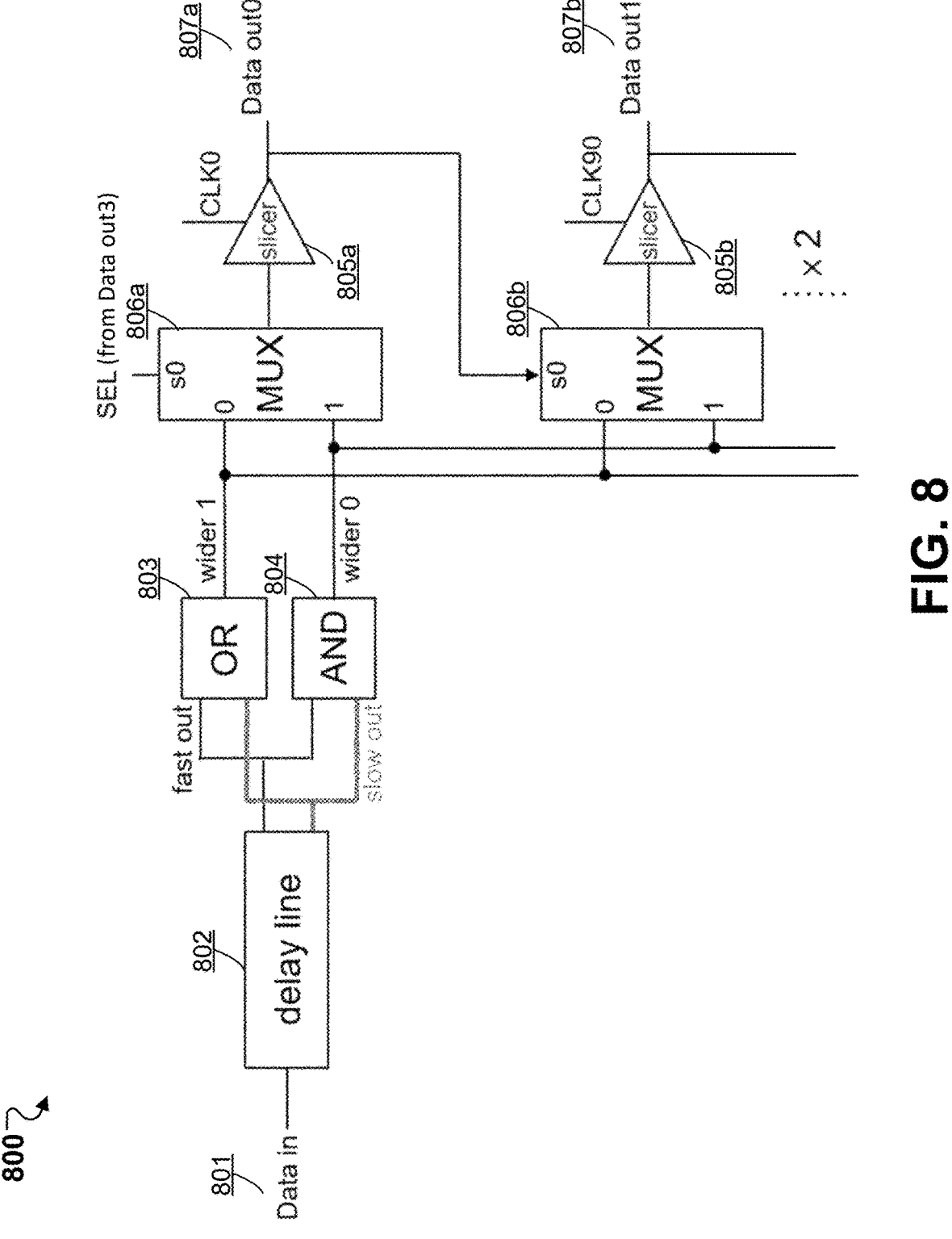

FIG. 8 illustrates an example DFE circuit 800, according to some implementations. The DFE circuit 800 receives input data from an input port 801 and, after compensation, outputs equalized data at output ports 807a, 807b, 807c, and 807d, which are collectively referred to as output ports 807. Similar to the operations of the DFE circuits 600 and 700, the delay line 802, the OR gate 803, and the AND gate 804 of the DFE circuit 800 provide two logic operation outputs that respectively expand ISI-distorted pulse widths of logic '1's and logic '0's. Also similar to the DFE circuit 700, the DFE circuit 800 provides quarter-rate equalization outputs at data ports 807, with the output signals respectively synchronized with clock signals CLK0, CLK90, CLK180, and CLK270.

A difference between the DFE circuits 700 and 800 is the arrangement of the MUXes and their corresponding slicer (s). As illustrated in FIG. 8, the logic operations from the OR gate 803 and the AND gate 804 are input to the MUX 806a first, and the output of the MUX 806a is then provided to a slicer 805a. Likewise, the logic operations from the OR gate 803 and the AND gate 804 are input to the MUX 806b first, and the output of the MUX 806b is then provided to a slicer 805b. The same arrangement applies to the other two slicer-MUX combinations. An advantage of the arrangement of the DFE circuit 800 is the reduction of number of slicers and hence the reductions of circuit size and circuit power consumption. However, for the MUXes in the DFE circuit 800 to timely make selections, the MUX delay plus the delay of the corresponding slicer is configured to be less than 1 UI. In other words, while the MUX delay in the DFE circuit 800 is configured to be less than 1 UI minus the slicer delay. Compared with the DFE circuit 700 whose architecture is often referred to as loop-unrolled architecture, the timing configuration of the DFE circuit 800 can be more constraining.

Although the DFE circuit 800 is illustrated and described as implementing a quarter-rate configuration, the same architecture can be applied to DFE circuits with full rate (e.g., one MUX and one slicer) or other number of rate (e.g., other number of MUXes and slicers) configurations. The clock frequency of the full rate configuration can be four times that of the quarter-rate configuration, and other number of rate configurations can have respective clock frequencies corresponding to different phases.

Figure 9:
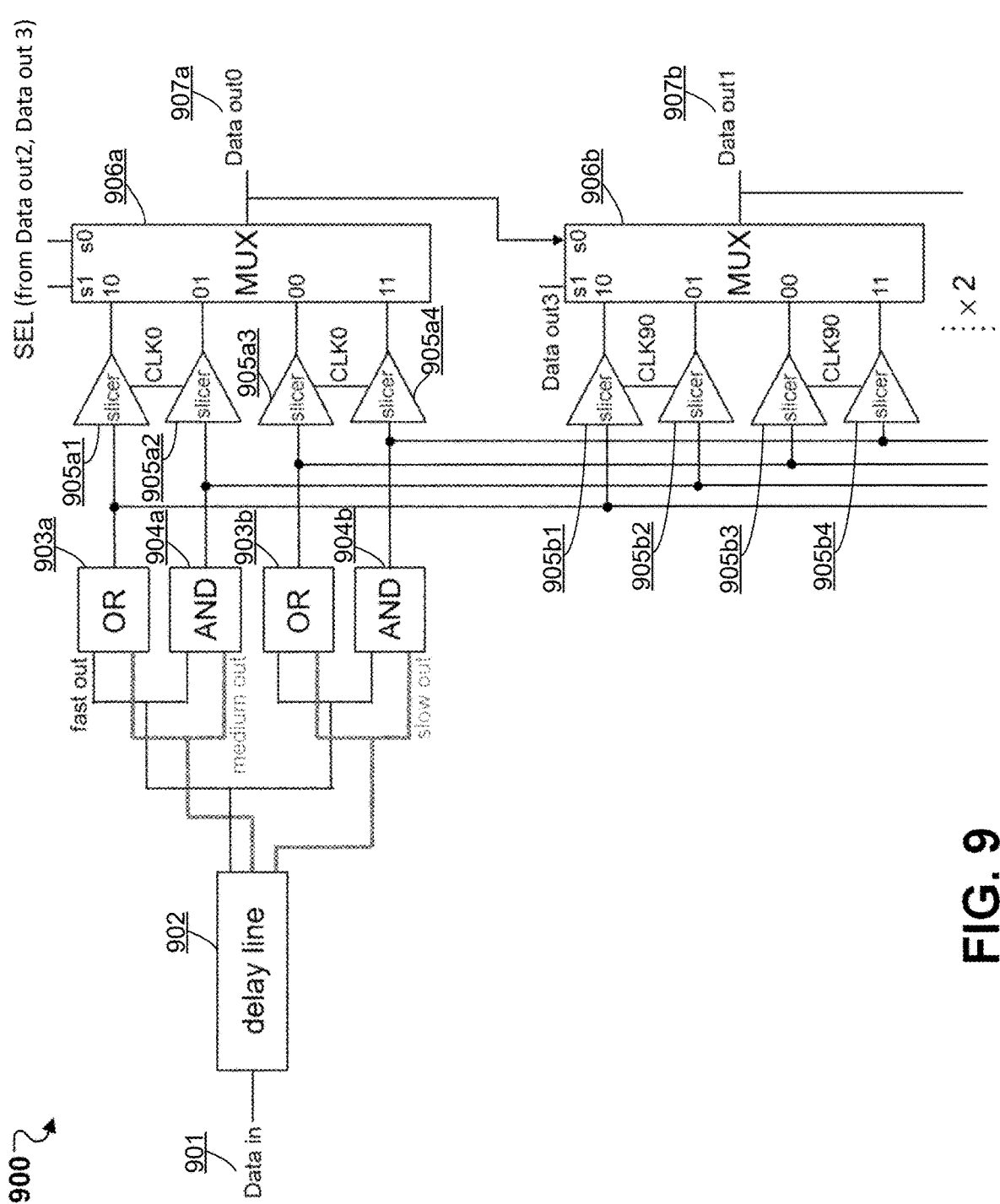

FIG. 9 illustrates an example DFE circuit 900, according to some implementations. The DFE circuit 900 receives input data from an input port 901 and, after compensation, outputs equalized data at an output ports 907a, 907b, 907c, and 907d, which are collectively referred to as output ports 907. The DFE circuit 900 is similar to the DFE circuits 700 and 800 in its quarter-rate configuration where the output ports 907 are respectively synchronized with clock signals CLK0, CLK90, CLK180, and CLK270. The DFE circuit 900 is also similar to the DFE circuit 700 in the loop-unrolled architecture where the MUXes 906a-906d are respectively preceded by slicers 905a1-905a4, 905b1-905b4, 905c1-905c4, and 905d1-905d4.

The delay line 902 of the DFE circuit 900 differs from those of the DFE circuit 600-800 in having a medium output in addition to the fast output and the slow output. Correspondingly, the DFE circuit 900 has two sets of logic circuits. The first set of logic circuits includes the OR gate 903a and the AND gate 904a, and the second set of logic circuits includes the OR gate 903b and the AND gate 904b. The first set can expand the width of ISI-distorted pulses according to the relative delay between the fast output and the medium output, while the second set can expand the width of ISI-distorted pulses according to the relative delay between the medium output and the slow output. When the two relative delays are different, the delay line 902 along with the OR gate 903a, the AND gate 904a, the OR gate 903b, and the AND gate 904b can provide two levels of pulse width expansion (e.g., a large expansion and a small expansion) to compensate for ISI-distorted logic '1' and two levels of pulse width expansion (e.g., a large expansion and a small expansion) to compensate for ISI-distorted logic '0.'

Having multiple levels of pulse width expansion can improve equalization performance because the ISI distortion from an immediately preceding symbol may be different from the ISI distortion from an earlier symbol. For example, assuming A, B, and C represent the current symbol, a symbol immediately preceding A, and a symbol further preceding B, respectively, the ISI distortion on A may be weaker when {CBA}={010} than when {CBA}={110}. To take into account this difference and more accurately compensate for ISI distortion on A, a 2-bit MUX can be used to select an appropriate level of pulse width expansion based on {CB}, as described below.

The outputs of the OR gate 903a, the AND gate 904a, the OR gate 903b, and the AND gate 904b are respectively input the slicers 950a1-905a4, whose outputs are then provided to a 2-bit MUX 906a as inputs. Similarly, the outputs of the OR gate 903a, the AND gate 904a, the OR gate 903b, and the AND gate 904b are respectively input the slicers 950a1-905a4 and then provided to a 2-bit MUX 906b as inputs. The outputs of the OR gate 903a, the AND gate 904a, the OR gate 903b, and the AND gate 904b are respectively input the slicers 950b1-905b4 and then provided to a 2-bit MUX 906b as inputs. Likewise and thus omitted from the illustration, the outputs of the OR gate 903a, the AND gate 904a, the OR gate 903b, and the AND gate 904b are respectively input the slicers 950c1-905c4 and then provided to a 2-bit MUX 906c as inputs, and the outputs of the OR gate 903a, the AND gate 904a, the OR gate 903b, and the AND gate 904b are respectively input the slicers 950d1-905d4 and then provided to a 2-bit MUX 906d as inputs.

Each of the 2-bit MUXes 906a-906d can be used to selectively compensate for ISI distortions based on two previous bits of the output data. Using the MUX 906a as an example, its two-bit selection pin {s1, s0} receives a selection signal SEL that is fed back from the output ports {data out 2, data out 3}. Due to the quarter-rate configuration, the feedback signal from the output port data out 3 is the symbol immediately preceding the current symbol, and the feedback signal from the output port data out 2 is the symbol immediately preceding the symbol on the output port data out 3. The MUXes 906b-906d can similarly receive feedbacks from two corresponding output ports.

The architecture of the DFE circuit 900 can be referred to as a two-tap DFE architecture, in which two bits of the output signal are fed back. By contrast, the architectures of the DFE circuits 600-800 can be considered as a one-tap DFE architecture, in which one bit of the output signal is fed back. Besides the two-tap and one-tap DFE architectures, some implementations have n>2 bits of the output signal fed back as the selection signal of an n-bit MUX with $2^n$ inputs. In an n-tap DFE architecture, a delay line (or more generally, a timing adjustment circuit) can provide outputs that create $2^{n-1}$ different relative delays, which correspond to $2^{n-1}$ different levels of pulse width expansion for ISI-distorted logic '1' and $2^{n-1}$ different levels of pulse width expansion for ISI-distorted logic '0.' In addition, the n-tap DFE architecture can have $2^{n-1}$ AND gates and $2^{n-1}$ OR gates.

Some features of the above-described DFE circuits 600-900 can be combined. For example, some implementations contemplate a two-tap, full rate DFE architecture, and some implementations contemplate a single-tap, non-loop-unrolled architecture. These example architectures, as well as many other variations from the above-described example DFE circuits 600-900, can be readily understood by one of ordinary skill in the art after reading this disclosure.

Although the DFE circuits 600-900 use OR gates and AND gates to expand pulse widths, other logic gates, such as NAND, NOR, XOR, XNOR, or combination thereof, can be used in lieu of or in addition to the OR gates and AND gates. Furthermore, other circuit like tuning the PMOS/NMOS driving strength of inverter can also achieve the effect of pulse widths expansion. One of ordinary skill in the art, after reading this disclosure, would have been able to arrive at the DFE circuits that have logic circuits modified from those in the DFE circuits 600-900.

FIG. 10 illustrates a flowchart of an example method 1000, according to some implementations. The method 1000 can be performed by, e.g., any of DFE circuits, 600-900. With the performance of the method 1000, the memory device can compensate for data waveform distortion from ISI.

At 1002, data is from a data input port. The data input port can be, e.g., input ports 601, 701, 801, or 901.

At 1004, a first delay is imposed on the data to generate first delayed data, and a second delay is imposed on the data to generate second delayed data. The first delay is different from the second delay.

At 1006, a first logic output is generated based on the first delayed data and the second delayed data. The first logic output expands a pulse width corresponding to a first logic value in the data.

At 1008, a second logic output is generated based on the first delayed data and the second delayed data. The second logic output expands a pulse width corresponding to a second logic value in the data.

At 1010, a multiplexer output is provided from a selection of at least one of (i) the first logic output or (ii) the second logic output. The selection is based on an equalization feedback.

At 1012, equalized data based on the multiplexer output is output at a data output port. The data output port can be, e.g., any of output ports 607, 707a-707d, 807a-807d, or 907a-907d.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An electronic circuit, comprising:
a data input port configured to receive data;
a timing adjustment circuit configured to receive the data from the data input port, wherein the timing adjustment circuit comprises: a first path configured to impose a first delay on the data to generate first delayed data, and a second path configured to impose a second delay on the data to generate second delayed data, the first delay being different from the second delay;
a first logic circuit configured to receive the first delayed data and the second delayed data and generate a first logic output, wherein the first logic circuit comprises an OR gate, and wherein the first logic output expands a pulse width corresponding to a first logic value in the data;
a second logic circuit configured to receive the first delayed data and the second delayed data and generate a second logic output, wherein the second logic circuit comprises an AND gate, and wherein the second logic output expands a pulse width corresponding to a second logic value in the data;
a multiplexer configured to select, based on an equalization feedback signal, at least one of (i) the first logic output or (ii) the second logic output, to provide a multiplexer output; and
a data output port configured to output equalized data based on the multiplexer output.

2. The electronic circuit of claim 1,
wherein the first logic value comprises logic 1, and
wherein the second logic value comprises logic 0.

3. The electronic circuit of claim 1,
wherein the first path comprises a first set of one or more inverters, and
wherein the second path comprises a second set of one or more inverters.

4. The electronic circuit of claim 3, wherein a number of inverters in the first set of one or more inverters is different from a number of inverters in the second set of one or more inverters.

5. The electronic circuit of claim 3,
wherein the first path further comprises a first set of one or more capacitors,
wherein the second path further comprises a second set of one or more capacitors,
wherein a number of the first set of one or more capacitors is different from a number of the second set of one or more capacitors.

6. The electronic circuit of claim 5, wherein:
at least one capacitor of the first set of one or more capacitors is tunable, or
at least one capacitor of the second set of one or more capacitors is tunable.

7. The electronic circuit of claim 1, further comprising:
at least one first slicer circuit configured to provide the first logic output to a first multiplexer input; and
at least one second slicer circuit configured to provide the second logic output to a second multiplexer input.

8. The electronic circuit of claim 1, further comprising at least one slicer circuit configured to provide the multiplexer output to the data output port.

9. The electronic circuit of claim 1,
wherein the timing adjustment circuit further comprises a third path configured to impose a third delay on the data to generate third delayed data, the third delay being different from the first delay and the second delay,
wherein the electronic circuit further comprises: a third logic circuit configured to receive the first delayed data and the third delayed data and generate a third logic output; and a fourth logic circuit configured to receive the first delayed data and the third delayed data and generate a fourth logic output, and
wherein the multiplexer is configured to select, based on the equalization feedback signal, one of at least (i) the first logic output, (ii) the second logic output, (iii) the third logic output, and (iv) the fourth logic output, to provide the multiplexer output.

10. The electronic circuit of claim 1, wherein the equalization feedback signal comprises one or more bits of the equalized data at one or more previous clock cycles.

11. The electronic circuit of claim 1,
wherein the multiplexer is a first multiplexer, the equalization feedback signal is a first equalization feedback signal, and the multiplexer output is a first multiplexer output, wherein the electronic circuit further comprises a second multiplexer configured to select, based on a second equalization feedback signal, one of at least (i) the first logic output and (ii) the second logic output, to provide a second multiplexer output, wherein the first multiplexer is configured to receive the second multiplexer output as the first equalization feedback signal, wherein the first multiplexer output is synchronized with a first clock and the second multiplexer output is synchronized with a second clock, the first clock and the second clock have a same rate but different phases.

12. A memory device comprising:

a memory interface circuit;

a memory cell array;

a data buffer circuit comprising an input buffer and an equalization circuit; and a control logic circuit coupled to the memory interface circuit, the memory cell array, and the data buffer circuit, wherein the equalization circuit comprises:

a data input port configured to receive data from the input buffer;

a timing adjustment circuit configured to receive the data from the data input port, wherein the timing adjustment circuit comprises: a first path configured to impose a first delay on the data to generate first delayed data, and a second path configured to impose a second delay on the data to generate second delayed data, the first delay being different from the second delay, wherein the first path comprises a first set of one or more inverters, the second path comprises a second set of one or more inverters, and a number of inverters in the first set of one or more inverters is different from a number of inverters in the second set of one or more inverters;

a first logic circuit configured to receive the first delayed data and the second delayed data and generate a first logic output, wherein the first logic output expands a pulse width corresponding to a first logic value in the data;

a second logic circuit configured to receive the first delayed data and the second delayed data and generate a second logic output, wherein the second logic output expands a pulse width corresponding to a second logic value in the data;

a multiplexer configured to select, based on an equalization feedback signal, at least one of (i) the first logic output or (ii) the second logic output, to provide a multiplexer output; and a data output port configured to output equalized data based on the multiplexer output.

13. The memory device of claim 12, wherein the first logic circuit comprises an OR gate, and the first logic value comprises logic 1, and wherein the second logic circuit comprises an AND gate, and the second logic value comprises logic 0.

14. The memory device of claim 12, wherein the first path further comprises a first set of one or more capacitors, and wherein the second path further comprises a second set of one or more capacitors.

15. The memory device of claim 14, wherein:

at least one capacitor of the first set of one or more capacitors is tunable, or at least one capacitor of the second set of one or more capacitors is tunable.

16. The memory device of claim 12, further comprising:

at least one first slicer circuit configured to provide the first logic output to a first multiplexer input; and at least one second slicer circuit configured to provide the second logic output to a second multiplexer input.

17. The memory device of claim 12, further comprising at least one slicer circuit configured to provide the multiplexer output to the data output port.

18. The memory device of claim 12, wherein the timing adjustment circuit further comprises a third path configured to impose a third delay on the data to generate third delayed data, the third delay being different from the first delay and the second delay, wherein the equalization circuit further comprises: a third logic circuit configured to receive the first delayed data and the third delayed data and generate a third logic output; and a fourth logic circuit configured to receive the first delayed data and the third delayed data and generate a fourth logic output, and wherein the multiplexer is configured to select, based on the equalization feedback signal, one of at least (i) the first logic output, (ii) the second logic output, (iii) the third logic output, and (iv) the fourth logic output, to provide the multiplexer output.

19. The memory device of claim 12, wherein the equalization feedback signal comprises one or more bits of the equalized data at one or more previous clock cycles.

20. The memory device of claim 12, wherein the multiplexer is a first multiplexer, the equalization feedback signal is a first equalization feedback signal, and the multiplexer output is a first multiplexer output, wherein the equalization circuit further comprises a second multiplexer configured to select, based on a second equalization feedback signal, one of at least (i) the first logic output and (ii) the second logic output, to provide a second multiplexer output, wherein the first multiplexer is configured to receive the second multiplexer output as the first equalization feedback signal, wherein the first multiplexer output is synchronized with a first clock and the second multiplexer output is synchronized with a second clock, the first clock and the second clock have a same rate but different phases.

21. A method for compensating for data distortion from channel loss, the method comprising:

receiving data from a data input port;

imposing a first delay on the data to generate first delayed data, and imposing a second delay on the data to generate second delayed data, the first delay being different from the second delay;

generating, using a first logic circuit, a first logic output based on the first delayed data and the second delayed data, wherein the first logic circuit comprises an OR gate, and wherein the first logic output expands a pulse width corresponding to a first logic value in the data;

generating, using a second logic circuit, a second logic output based on the first delayed data and the second delayed data, wherein the second logic circuit comprises an AND gate, and wherein the second logic output expands a pulse width corresponding to a second logic value in the data;

selecting, based on an equalization feedback signal, at least one of (i) the first logic output or (ii) the second logic output, to provide a multiplexer output; and outputting, at a data output port, equalized data based on
the multiplexer output.

* * * * *